(12) United States Patent
Theuss

(10) Patent No.: US 8,669,143 B2
(45) Date of Patent: Mar. 11, 2014

(54) DEVICE AND METHOD FOR MANUFACTURING A DEVICE

(71) Applicant: Infineon Technologies AG, Neubiberg (DE)

(72) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/708,885

(22) Filed: Dec. 7, 2012

(65) Prior Publication Data

US 2013/0095609 A1    Apr. 18, 2013

Related U.S. Application Data

(62) Division of application No. 12/752,851, filed on Apr. 1, 2010, now Pat. No. 8,350,381.

(51) Int. Cl.
*H01L 21/00* (2006.01)

(52) U.S. Cl.
USPC .......................................... 438/126; 438/127

(58) Field of Classification Search
None
See application file for complete search history.

(56) References Cited

U.S. PATENT DOCUMENTS

| | | | |
|---|---|---|---|
| 4,894,707 A * | 1/1990 | Yamawaki et al. | 257/680 |
| 5,241,456 A | 8/1993 | Marcinkiewicz et al. | |
| 5,353,498 A | 10/1994 | Fillion et al. | |
| 5,355,102 A | 10/1994 | Kornrumpf et al. | |
| 5,497,033 A | 3/1996 | Fillion et al. | |
| 5,565,706 A | 10/1996 | Miura et al. | |
| 5,780,776 A | 7/1998 | Noda | |
| 5,888,849 A * | 3/1999 | Johnson | 438/126 |
| 6,031,025 A | 2/2000 | Mercer et al. | |
| 6,137,163 A * | 10/2000 | Kim et al. | 257/686 |
| 6,420,201 B1 * | 7/2002 | Webster | 438/51 |
| 6,541,307 B2 * | 4/2003 | Yu et al. | 438/112 |
| 7,109,574 B2 * | 9/2006 | Chiu et al. | 257/684 |
| 7,364,945 B2 * | 4/2008 | Shim et al. | 438/109 |
| 7,468,556 B2 * | 12/2008 | Logan et al. | 257/723 |
| 7,687,315 B2 * | 3/2010 | Carson | 438/109 |
| 7,727,819 B2 * | 6/2010 | Yoneda et al. | 438/127 |
| 7,855,100 B2 * | 12/2010 | Shim et al. | 438/107 |
| 7,939,901 B2 * | 5/2011 | Minamio et al. | 257/433 |
| 7,956,449 B2 * | 6/2011 | Lee et al. | 257/686 |
| 7,982,297 B1 | 7/2011 | Heo | |
| 8,021,924 B2 | 9/2011 | Shim et al. | |
| 2001/0030059 A1 | 10/2001 | Sugaya et al. | |
| 2002/0089066 A1 * | 7/2002 | Massoodi et al. | 257/777 |
| 2005/0090050 A1 * | 4/2005 | Shim et al. | 438/200 |
| 2005/0146000 A1 | 7/2005 | Kim et al. | |
| 2006/0001116 A1 * | 1/2006 | Auburger et al. | 257/433 |
| 2006/0131736 A1 | 6/2006 | Jansman et al. | |
| 2007/0164402 A1 | 7/2007 | Jung et al. | |
| 2009/0051024 A1 | 2/2009 | Chia | |
| 2010/0019368 A1 | 1/2010 | Shin | |

* cited by examiner

*Primary Examiner* — Scott B Geyer
(74) *Attorney, Agent, or Firm* — Slater & Matsil, L.L.P.

(57) ABSTRACT

Methods for manufacturing packaged devices are disclosed. In one embodiment a method includes encapsulating a first semiconductor chip with a first encapsulant, wherein the first encapsulant includes a cavity on a first main surface, mounting an electrical component on a carrier, the electrical component being a MEMS device, and placing the carrier on the first main surface of the first encapsulant such that the electrical component is enclosed by the cavity.

27 Claims, 9 Drawing Sheets

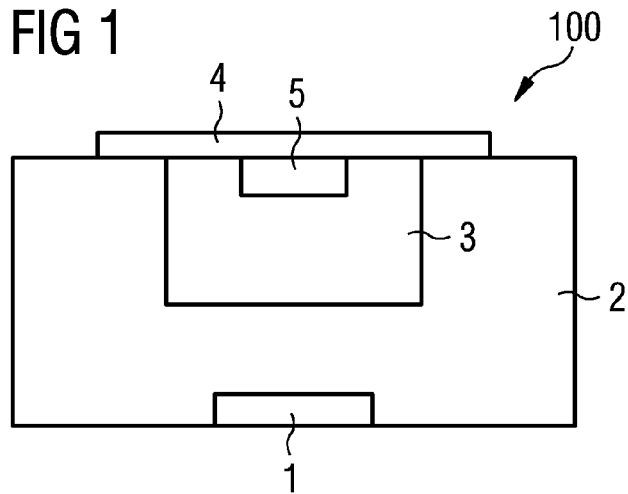
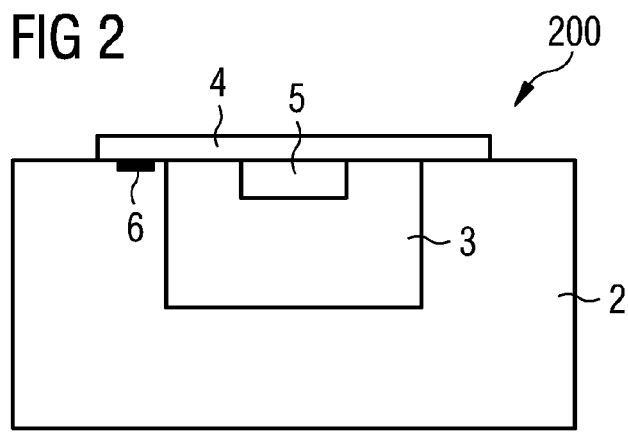
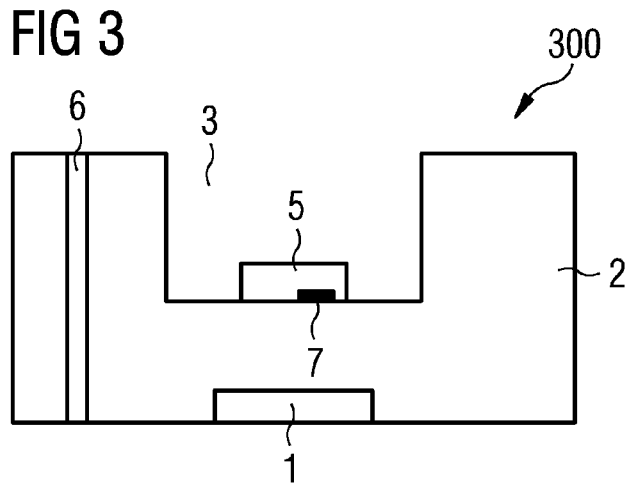

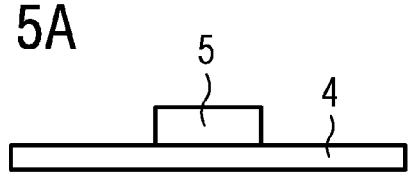
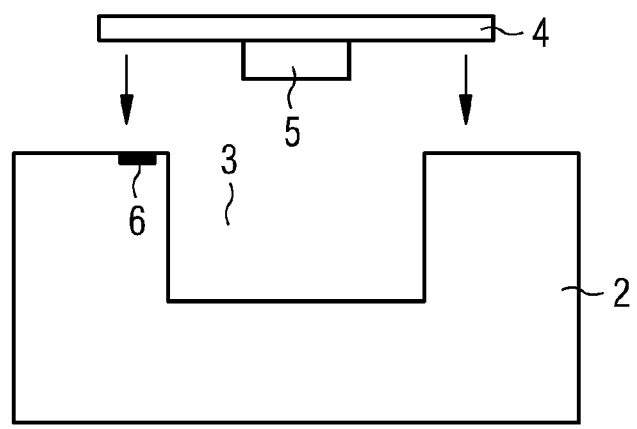
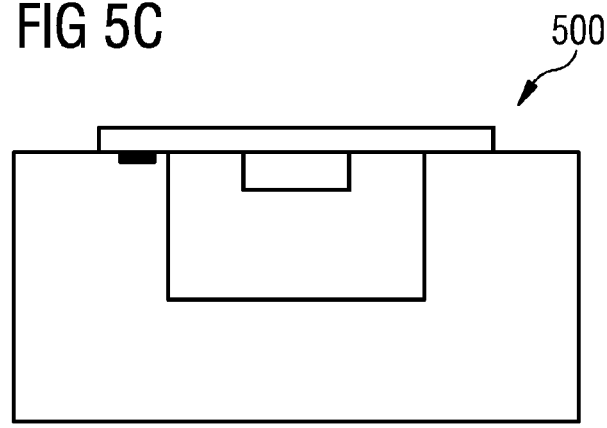

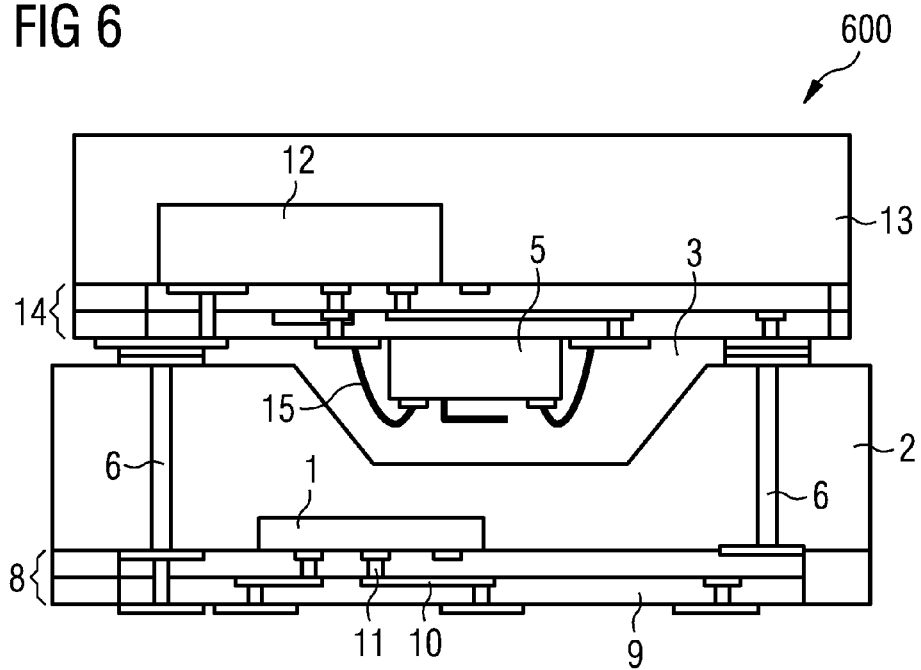
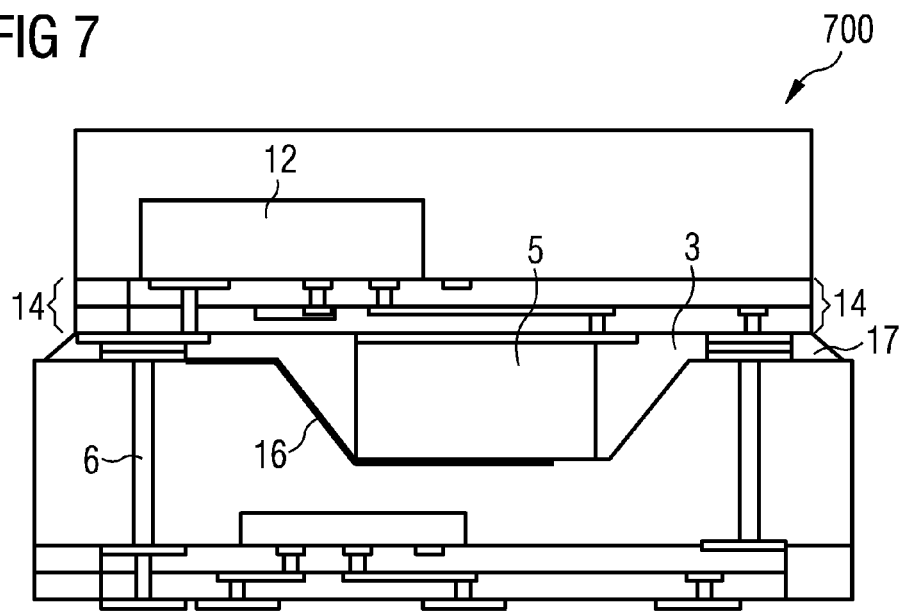

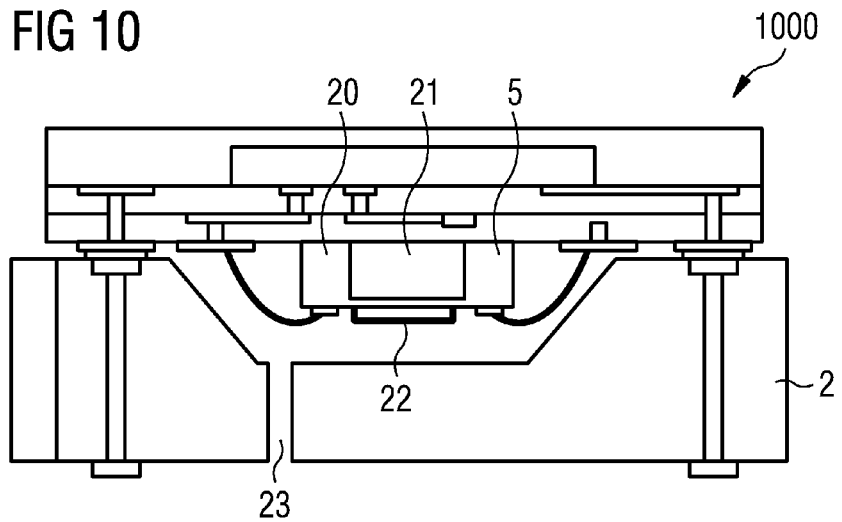
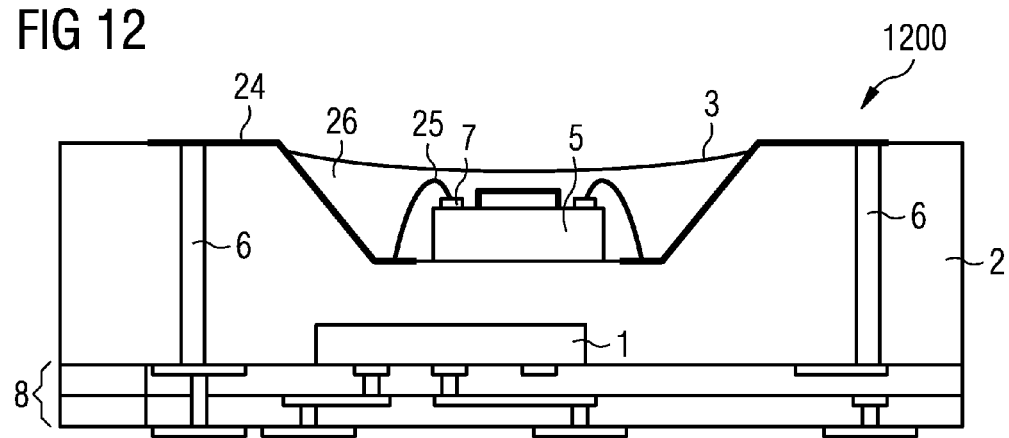

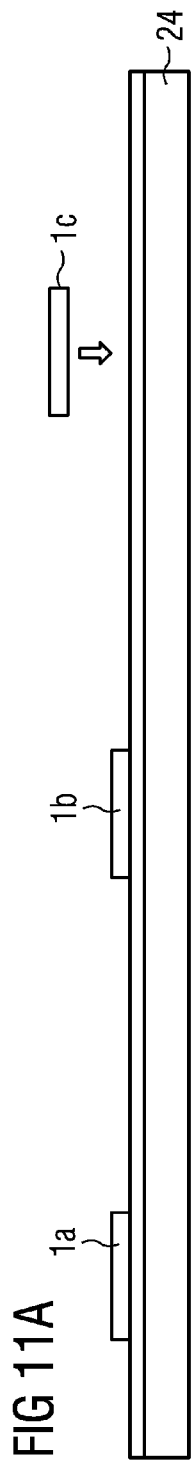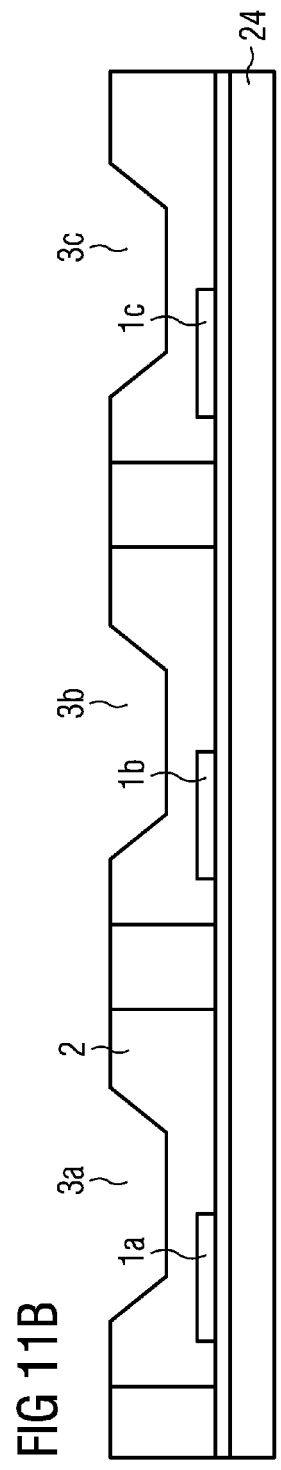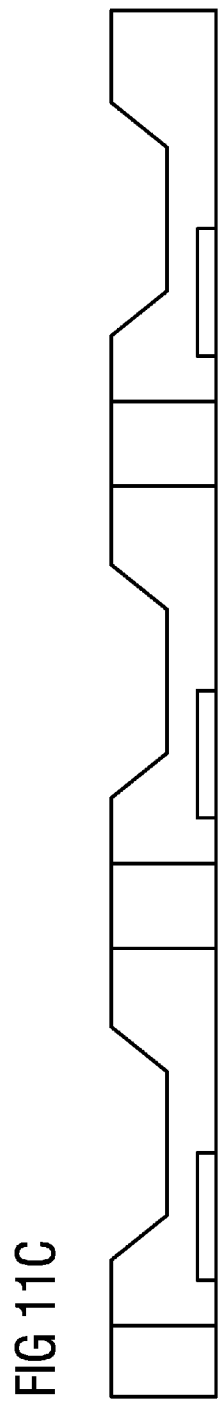

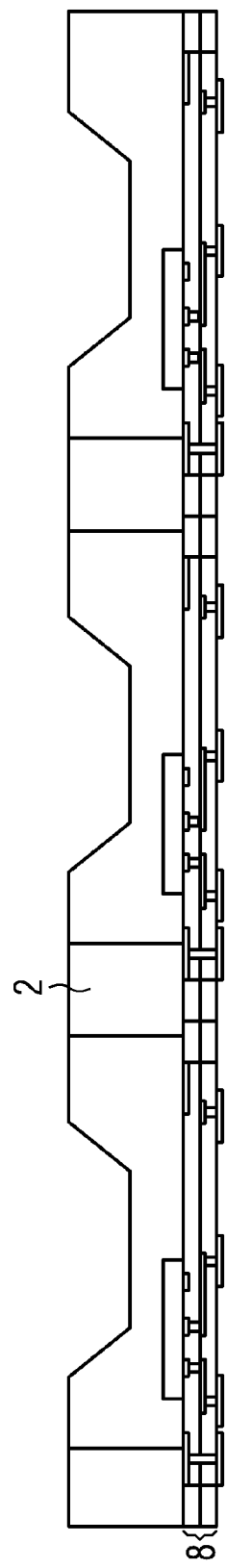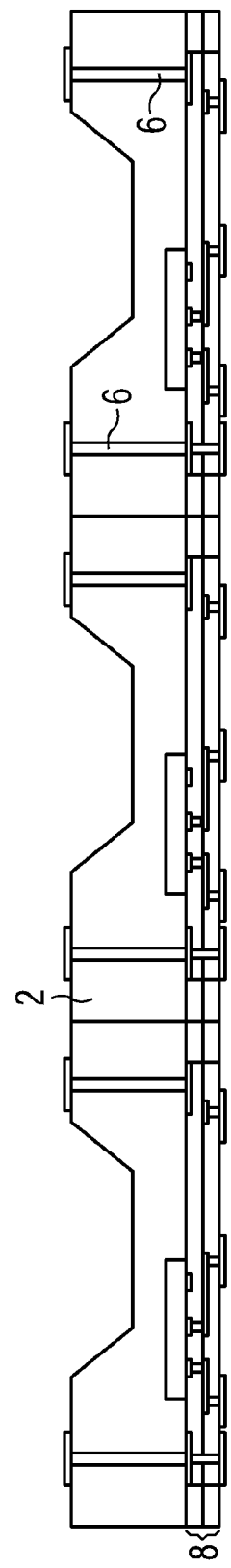

DEVICE AND METHOD FOR MANUFACTURING A DEVICE

This is a divisional application of U.S. application Ser. No. 12/752,851, entitled "Device and Method for Manufacturing a Device," which was filed on Apr. 1, 2010 (issued as U.S. Pat. No. 8,350,381 on Jan. 8, 2013) and is incorporated herein by reference.

TECHNICAL FIELD

The invention relates to a device and a method for manufacturing a device.

BACKGROUND

Electrical devices may include electrical components such as integrated circuits and semiconductor chips. Some of these electrical components require a cavity to function properly while others may be covered by an encapsulant.

Electrical devices are often referred to as packages when they include electrical components embedded in a molded housing. The Package on Package (PoP) technique is an integrated circuit packaging technique, wherein multiple packages are arranged on top of one another.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 1 schematically illustrates a cross-section of a device 100 as an exemplary embodiment;

FIG. 2 schematically illustrates a cross-section of a device 200 as a further exemplary embodiment;

FIG. 3 schematically illustrates a cross-section of a device 300 as a further exemplary embodiment;

FIGS. 5A to 5C schematically illustrate a further exemplary method to fabricate a device 500 shown in a cross-sectional view;

FIG. 6 schematically illustrates a cross-section of a device 600 as a further exemplary embodiment;

FIG. 7 schematically illustrates a cross-section of a device 700 as a further exemplary embodiment;

FIG. 10 schematically illustrates a cross-section of a device 1000 as a further exemplary embodiment;

FIGS. 11A to 11G schematically illustrate a further exemplary method to fabricate a device 1100 shown in a cross-sectional view; and FIG. 12 schematically illustrates a cross-section of a device 1200 as a further exemplary embodiment.

DETAILED DESCRIPTION OF ILLUSTRATIVE EMBODIMENTS

Figure 4A:
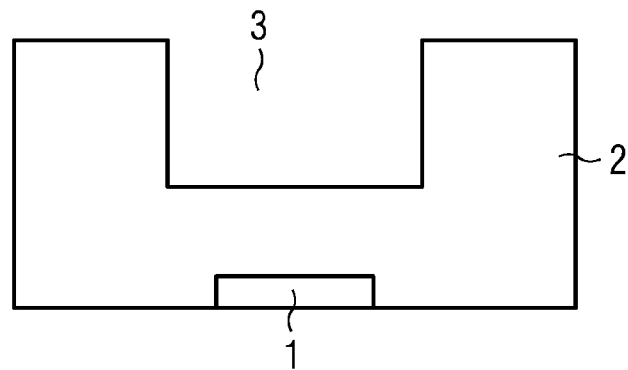
FIGS. 4A to 4C schematically illustrate an exemplary method to fabricate a device 400 shown in a cross-sectional view.

Aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to a person skilled in the art that one or more aspects of the embodiments may be practiced with a lesser degree of the specific details. In other instances known structures and elements are shown in schematic form in order to facilitate describing one or more aspects of the embodiments. The following description is therefore not to be taken in a limiting sense and the scope is defined by the appended claims. It should also be noted that the representations of the various elements in the figures are not necessarily to scale.

In the following detailed description reference is made to the accompanying drawings which form a part thereof and in which is shown by way of illustration specific embodiments in which the invention may be practiced. In this regard, directional terminology, such as, e.g., "upper", "lower", "top", "bottom", "left-hand", "right-hand", "front side", "backside", etc., is used with reference to the orientation of the figures being described. Because components of embodiments can be positioned in a number of different orientations, the directional terminology is used for purposes of illustration and is in no way limiting. It is understood that further embodiments may be utilized and structural or logical changes may be made without departing from the scope of the present invention. Of course, the features of the various exemplary embodiments described herein may be combined with each other, unless specifically noted otherwise.

As employed in this specification, the terms "coupled", "electrically coupled", "connected" or "electrically connected" are not meant to mean that the elements must be directly coupled or connected together. Intervening elements may be provided between the "coupled", "electrically coupled", "connected" or "electrically connected" elements.

The devices described below may include sensor chips. The specific embodiment of these sensor chips is not important in this case. The sensor chips may contain electromechanical or electrooptical functional elements. An example of an electromechanical sensor is a microphone or a gas sensor. Examples for the electrooptical case are photodiodes or diode lasers. The sensor chips may also function fully electrically, for example, as Hall effect sensors. The sensor chips may be embodied as so-called micro electro mechanical system (MEMS), wherein micromechanical movable structures such as, for example, bridges, membranes or reed structures may be provided. Such sensor chips may be motion sensors which may be embodied as acceleration sensors (detecting accelerations in different spatial directions) or rotation sensors. Sensors of this type are also referred to as gyrosensors, roll-over sensors, impact sensors, inertial sensors, etc. They are used, for example, in the automotive industry for signal detection in ESP (Electronic Stability Program) systems, ABS (Anti-lock Braking Systems), airbags and the like. Depending on their functionality, some of the sensor chips like impact sensors need to be provided with signals to be measured and thus need to interact with the environment. In contrast, other sensor chips like inertial sensors do not necessarily need to interact with signals and may thus be separated from the environment. Usually sensor chips are made of a semiconductor material. However, the sensor chips are not limited to be fabricated from a specific semiconductor material. They may additionally contain non-conductive inorganic and/or organic materials.

Besides the mentioned sensor chips, the devices described below may include further semiconductor chips of different types. These semiconductor chips may be manufactured using different technologies and may, for example, include integrated electrical, electro-optical or electro-mechanical circuits and/or passive devices. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Further, the semiconductor chips may include control circuits, i.e., logic integrated circuits to control the integrated circuits of the vertical semiconductor chip, microprocessors, or microelectromechanical components. For example, a semiconductor chip may be embodied as an application specific integrated circuit (ASIC) that processes signals received from a sensor chip and may also be configured to control the sensor chip. The semiconductor chips need not be manufactured from specific semiconductor material, for example, Si, SiC, SiGe, GaAs, and, further, may contain inorganic and/or organic materials that are not semiconductors, such as, for example, insulators, plastics or metals.

The devices described below may include a power supply, for example, one or more batteries that may be fabricated by arbitrary microfabrication processes. Preferably, these processes are compatible with processes used for the fabrication of integrated circuits and semiconductor chips. This way, the power supply or battery may be an integral part of the integrated circuit, i.e., integrated with the rest of the device. Advantageously, the same (low cost) processes used for the fabrication of other integrated circuits may thus also be applied to fabricate devices including a power supply. The power supply may be formed in any shape or size required by the desired functionality of the individual device. For example, the power supply may be a coin cell battery. The devices may contain a single battery cell or an array of battery cells that may be connected in varying series/parallel combinations to achieve different operating voltages or capacities. For example, the batteries may be based on the Lithium-ion (3.5-4 V) or the Nickel/Zinc (1.5-1.65 V) chemistries. The power supply may be rechargeable or not. Further, the power supply may be combined with a control circuit to protect the power supply from overcharge or inform the user about the state of the power supply.

The devices described below may include one or more encapsulants. The encapsulation material may be electrically insulating and may be any appropriate duroplastic, thermoplastic or thermosetting material or laminate (prepreg) and may contain filler materials. In particular, the encapsulant may be used to cover or encapsulate one or more semiconductor chips. After its deposition, the encapsulant may be only partially hardened and may be completely hardened after the application of energy (e.g., heat, UV light, etc.) to form a housing or package. Various techniques may be employed to cover semiconductor chips with electrically insulating material, for example, compression molding, injection molding, powder molding, liquid molding or lamination. For example, an encapsulant may be fabricated using a molding tool. The molding tool may include an upper mold half and a lower mold half defining a mold cavity. The encapsulant may then be formed in the closed molding tool from a mold compound that is conveyed under pressure in a hot, plastic state from a central reservoir into the mold cavity. The mold compound may include any appropriate duroplastic, thermoplastic or thermosetting material, e.g., a resin material such as, e.g., epoxy.

The devices described below may include one or more redistribution layers. Typically, a redistribution layer contains one or more structured conductive layers separated by dielectric or electrically insulating layers and interconnected by conductive through connections (vias).

The conductive layers may be employed as wiring layers to make electrical contact with semiconductor chips from outside the device and/or to make electrical contact with other semiconductor chips and/or components contained in the device. The conductive layers may couple contact pads of semiconductor chips to external contact pads. The conductive layers may have other functions as well, for example, they may be used as ground or electrical shielding layers. The conductive layers may be manufactured with any desired geometric shape and any desired material composition. For example, the conductive layers may be structured and may have the shape of conductor lines (or conductor tracks), but may also be in the form of a layer covering an area. Any desired metal, for example, aluminum, nickel, palladium, titanium, titanium tungsten, silver, tin, gold or copper, or metal alloys may be used as the material. The conductive layers need not be homogenous or manufactured from just one material, that is to say various compositions and concentrations of the materials contained in the conductive layers are possible. Further, the conductive layers may be arranged above or below or between dielectric or electrically insulating layers. The conductive layers may have different thicknesses.

The dielectric layers may be fabricated in various ways. For example, a dielectric layer may be deposited from a gas phase or from a solution, or can be laminated onto a surface, for example, the surface of a semiconductor chip or a conductive layer. Further, thin-film technology methods may be used for applying a dielectric layer. The dielectric layer may be fabricated from a polymer, such as parylene, photoresist material, imide, epoxy, duroplast, silicone, silicon nitride or an inorganic, ceramic-like material, such as silicone-carbon compounds.

The devices described below may include further electrical through connections (vias) that are not necessarily included in a redistribution layer. For example, a through connection may also extend from an upper face to a lower face of an encapsulant. The through connections may be manufactured in any appropriate way. For example, through-holes extending from an upper face to a lower face of an encapsulant may be drilled using a laser beam, an etching method or another appropriate method. Afterwards, a metal material may be deposited in the through-holes to form the electrically conductive through connections in the encapsulant. For example, the metal material may be galvanically deposited and may include copper or other metals or metal alloys.

The methods described below may be based on the embedded device wafer level packaging (eWLP) technology which is developed from standard wafer level packaging (WLP) technology. Standard WLP technology is defined such that virtually all technology steps are performed on wafer level. More specifically, in standard WLP, dielectric and metal layers are deposited and processed on the active surface of the wafer before the wafer is cut into single chips. In contrast to WLP technology, in eWLP technology the front-end processed and probed wafer is first singulated to obtain single chips. The chips are then placed onto a support in a spaced-apart relationship. In a next step, the spaced-apart chips on the support are molded, e.g., by using a liquid mold compound that is dispensed over the chips on the support. Thereby, the gaps between the placed chips are filled with liquid mold compound. After curing the mold compound, the support is removed to obtain the so-called reconfigured wafer, in which the chips are distributed within the mold compound in a regular, array-like fashion. This reconfigured wafer is then processed according to standard WLP technology, i.e., the dielectric layers and the metal redistribution layer are applied typically by using thin-film processes. Moreover, appropriate connecting elements such as solder balls, solder bumps or metal elements may optionally be applied on wafer level. After finishing an interconnect step, the molded reconfigured wafer is singularized into single packages.

The following figures schematically illustrate devices and methods for fabricating devices as exemplary embodiments. The illustration of the devices and methods is of qualitative nature and does not necessarily illustrate the explicit inner composition of the devices, for example, their complete inner electronic configuration. Accordingly, the figures do not necessarily show all components required for an actual operation of the illustrated devices.

FIG. 1 schematically illustrates a device 100 as an exemplary embodiment. The device 100 includes a semiconductor chip 1 encapsulated by an encapsulant 2. The encapsulant 2 includes a cavity 3. The device 100 further includes a carrier 4 onto which an electrical component 5 is mounted. The carrier 4 is arranged such that the electrical component 5 is enclosed by the cavity 3.

The electrical component 5 may require the cavity 3 to function properly. The electrical component 5 may be any type of component as described in foregoing paragraphs, for example, a power supply, a semiconductor chip or a (sub) system including multiple components interacting with one another. In particular, the electrical component 5 may be a MEMS having movable parts like tongue structures or membranes.

For the case of the electrical component 5 being configured to process external signals, the device 100 may optionally include an aperture as an inlet for signals to be measured. Although being enclosed by the cavity 3, the electrical component 5 is thus not necessarily isolated from the environment and may interact with the same. In other embodiments, the cavity 3 may also be sealed for functional or reliability reasons such that the electrical component 5 is isolated from environmental influences. A sealing may, for example, be provided by glue or a closed metal ring.

In other embodiments, the electrical component 5 may require an environment having a low dielectric constant to function properly. This requirement is fulfilled for the case of the cavity 3 containing air. However, the cavity 3 may also be filled with any suitable material depending on the desired functionality of the device 100.

During the fabrication of the encapsulant 2 its size and shape may be adjusted such that the cavity 3 is capable of enclosing the electrical component 5. By arranging the encapsulant 2 and the carrier 4 in an adequate manner relative to each other, the electrical component 5 is then enclosed by the cavity 3. That is, due to combining an appropriate form of the encapsulant 2 and an appropriate arrangement of the carrier 4 and the encapsulant 2 relative to each other, there are no further steps required to realize the enclosing of the electrical component 5. For example, there is no need for an additional lid to close the cavity 3 since this is already done by the encapsulant 2. Compared to similar devices, the device 100 thus includes a smaller number of components and may be manufactured by processes including a smaller number of process steps. Therefore, the device 100 advantageously provides a reduce of material and manufacturing costs.

It is to be noted that the semiconductor chip 1 and the encapsulant 2 may be part of a first package while the carrier 4 and the electrical component 5 may be part of a second package. The combination of the first and the second package may then represent a PoP-arrangement.

FIG. 2 schematically illustrates a device 200 as a further exemplary embodiment. The device 200 includes an encapsulant 2 having a cavity 3 and an electrical contact 6. The device 200 further includes a carrier 4 and an electrical component 5 mounted on the carrier 4. The carrier 4 is arranged such that the electrical component 5 is enclosed by the cavity 3 and an electrical connection between the electrical component 5 and the electrical contact 6 is established.

Statements made in connection with device 100 may also hold true for the device 200 of FIG. 2. For example, the electrical component 5 may be a MEMS, a battery or an electrical component requiring a low dielectric constant. The components of device 200 may show single or multiple features that have been described in foregoing paragraphs.

Note that FIG. 2 does not explicitly illustrate an inner composition of the device 200. In particular, FIG. 2 does not explicitly show an electrical connection between the electrical component 5 and the electrical contact 6. However, it is understood that such an electrical connection may be established in various ways. For example, there may be a redistribution layer included in or on a face of the carrier 4 providing such a connection. Further, it is understood that the electrical contact 6 may also be connected to further components (not shown). For example, the electrical contact 6 may also be a connection extending through the encapsulant 2 suitable of being electrically contacted on the lower face of the encapsulant 2 by other components (not shown).

Again, a combination of an appropriate form of the encapsulant 2 and an appropriate arrangement of the carrier 4 and the encapsulant 2 results in advantages already described in connection with device 100. Additionally, the step of arranging the carrier 4 is also utilized to provide the electrical connection between the electrical component 5 and the electrical contact 6.

FIG. 3 schematically illustrates a device 300 as a further exemplary embodiment. The device 300 includes an encapsulant 2 comprising a cavity 3 and an electrical contact 6 in the form of an electrical through connection. The device 300 further includes a semiconductor chip 1 encapsulated by the encapsulant 2 and an electrical component 5. The electrical component 5 includes an electrical contact 7 and is arranged in the cavity 3. An electrical connection between the electrical contact 7 and the electrical through connection 6 is established. Note that the electrical contact 7 of the electrical component 5 is not necessarily arranged on a lower face of the electrical component 5, but may also be placed on an upper face of the electrical component 5. The components of device 300 may show single or multiple features that have been described in foregoing paragraphs.

FIG. 3 does not explicitly illustrate an inner composition of the device 300. In particular, FIG. 3 does not explicitly show an electrical connection between the electrical through connection 6 and the electrical contact 7. However, it is understood that such an electrical connection may be established in various ways. For example, said electrical connection may be established by conductor lines proceeding along a surface of the encapsulant 2. In one embodiment, an electrical connection between an electrical contact on the upper face of the electrical component 5 and a conductor line on the surface of the encapsulant 2 may be established by means of a bond wire.

The components of the device 300 may be a part of a first package. By mounting a second package (not shown) on top of the first package, the electrical component 5 may be enclosed by the cavity 3. The cavity 3 of device 300 may be fabricated during the manufacturing process of the encapsulant 2. That is, there is no need for additional steps that provide a cavity, for example, providing an additional box into which the electrical component 5 can be mounted. Advantageously, this results in a reduce of material and manufacturing costs.

Figure 4B:
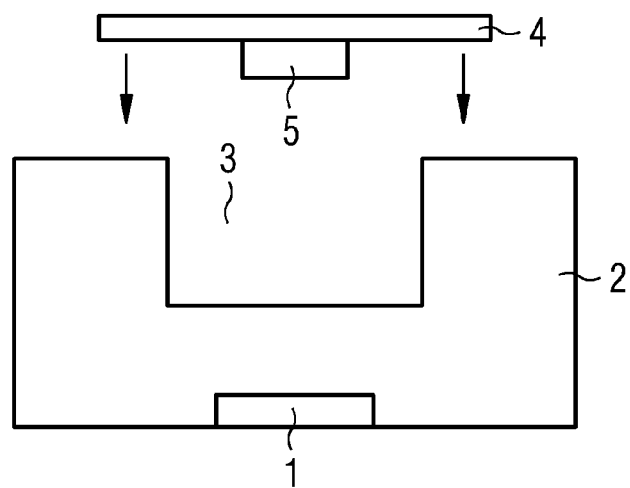
Figure 4C:
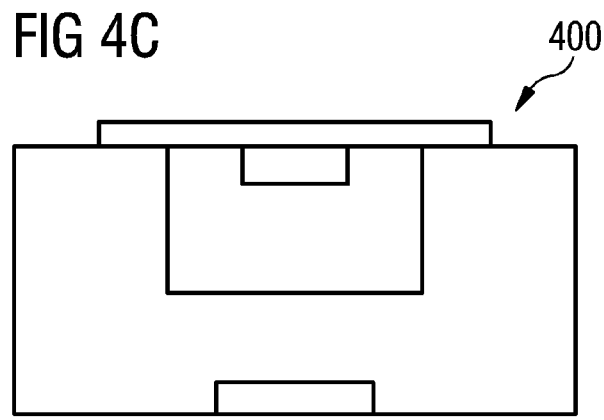

FIGS. 4A to 4C schematically illustrate an exemplary method to fabricate a device 400 similar to device 100. Above given comments concerning components of device 100 therefore may also hold true for like components of device 400.

In a first method step (not shown) a semiconductor chip 1 is provided. In a second method step (see FIG. 4A) the semiconductor chip 1 is encapsulated with an encapsulant 2 including a cavity 3. For example, the encapsulant 2 may be fabricated from a mold compound using a molding tool. The form of the molding tool may then be adjusted to the desired shape and size of the cavity 3. In a third method step (not shown) an electrical component 5 is mounted on a carrier 4, for example, by using a glue or solder material. FIG. 4B shows a fourth method step, wherein the carrier 4 is arranged such that the electrical component 5 is enclosed by the cavity 3. For the case of the carrier 4 and the electrical component 5 being a part of a first package and the semiconductor chip 1 and the encapsulant 2 being a part of a second package, the step shown in FIG. 4B would correspond to a stacking of packages resulting in a PoP-arrangement. FIG. 4C illustrates a device 400 as a product of the described fabrication method.

FIGS. 5A to 5C schematically illustrate an exemplary method to fabricate a device 500 similar to device 200. Above given comments concerning components of device 200 therefore may also hold true for like components of device 500.

FIG. 5A shows a first method step in which a first electrical component 5 is mounted on a carrier 4. In a second method step (not shown) an encapsulant 2 including a cavity 3 and an electrical contact 6 is provided. FIG. 5B illustrates a third method step, wherein the carrier 4 is arranged such that the electrical component 5 is enclosed by the cavity 3 and an electrical connection between the electrical component 5 and the electrical contact 6 is established. For the case of the carrier 4 and the electrical component 5 being a part of a first package and the encapsulant 2 being a part of a second package, the step of FIG. 5B would correspond to a stacking of packages resulting in a PoP-arrangement. FIG. 5C illustrates a device 500 as a product of the described fabrication method.

FIG. 6 schematically illustrates a device 600 as a further exemplary embodiment. The device 600 includes a first semiconductor chip 1 encapsulated by a first encapsulant 2 including a cavity 3. Electrical through connections 6 extend from a lower face of the encapsulant 2 to an upper face of the encapsulant 2 to provide an electrical connection through the encapsulant 2. A first redistribution layer 8 is arranged on a lower side of the encapsulant 2. The first redistribution layer 8 may include dielectric layers 9 and conductive layers 10. The conductive layers 10 are electrically connected with one another by means of vias 11. In FIG. 6, the first redistribution layer 8 provides an electrical connection between possible external applications (not shown) and the first semiconductor chip 1, as well as an electrical connection between possible external applications and the through connections 6. For example, external applications may be printed circuit boards (PCB) or further electrical components.

The device of FIG. 6 further includes a second semiconductor chip 12 encapsulated by a second encapsulant 13. A second redistribution layer 14 is arranged on a lower side of the second encapsulant 13. The structure of the second redistribution layer 14 may be similar to the structure of the first redistribution layer 8. An electrical component 5 is mounted on the second redistribution layer 14, i.e., the second redistribution layer 14 serves as a carrier for the electrical component 5. The second encapsulant 13 is arranged such that the electrical component 5 is enclosed by the cavity 3. The electrical component 5 is electrically coupled to the second redistribution layer 14 by means of bond wires 15.

The second redistribution layer 14 provides various electrical connections between various components of the device 600. This way, components of the device 600 may interact and communicate among each other. The second redistribution layer 14 provides an electrical connection between the electrical component 5 and the second semiconductor chip 12. In one embodiment with the electrical component 5 being a MEMS and the second semiconductor chip 12 being an ASIC, the second redistribution layer 14 provides a possibility for the ASIC to control the MEMS. Further, the redistribution layers 8 and 14 and the through connections 6 provide an electrical connection between a possible external application and the second semiconductor chip 12. This way, it is possible to control the second semiconductor chip 12 and the electrical component 5 from the outside. It is understood that the device 600 may include further electrical connections depending on the desired functionality of the device 600. Of course, for a person skilled in the art further electrical connections become apparent from FIG. 6.

FIG. 7 schematically illustrates a device 700 as a further exemplary embodiment. The device 700 includes similar components as shown in FIG. 6. Above given comments concerning components of device 600 therefore may also hold true for like components of device 700.

In contrast to FIG. 6, the electrical component 5 of device 700 is a power supply, for example, a battery. The battery 5 is electrically connected to the second semiconductor chip 12 via the second redistribution layer 14. This way, the battery 5 may supply power to the second semiconductor chip 12. The battery 5 may be rechargeable or not and may also be removable. Further, the device 700 includes an electrical connection 16 that electrically couples the battery 5 to the through connection 6 and the second redistribution layer 14. It is understood that the device 700 may include further electrical connections depending on the desired functionality of the device 700. Of course, for a person skilled in the art further electrical connections become apparent from FIG. 7.

In FIG. 7, the cavity 3 is sealed such that the battery 5 is isolated from the environment for functional or reliability reasons. For example, a sealing 17 may be established by glue or a soldered metal ring.

Figure 8:
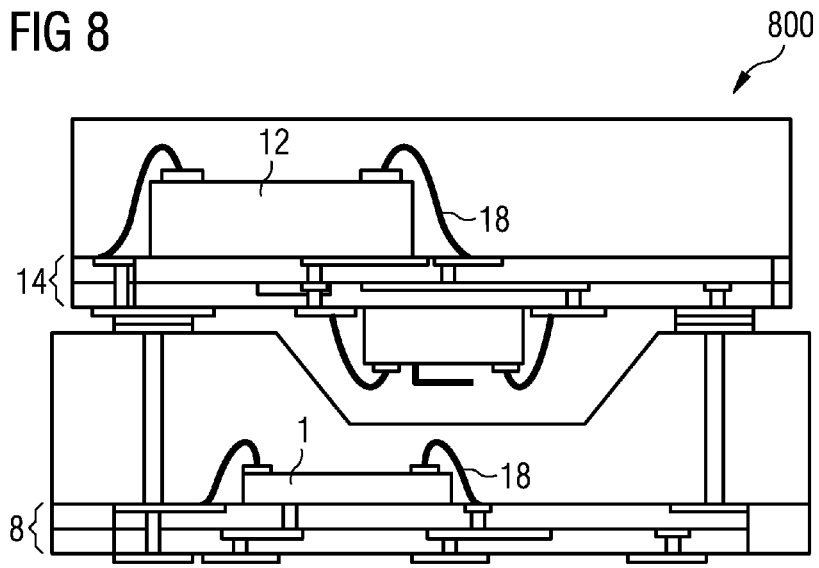
FIG. 8 schematically illustrates a cross-section of a device 800 as a further exemplary embodiment.

FIG. 8 schematically illustrates a device 800 as a further exemplary embodiment. The device 800 includes similar components as device 600. In contrast to FIG. 6, the first semiconductor chip 1 and the second semiconductor chip 12 are connected to the first redistribution layer 8 and the second redistribution layer 14 by bond wires 18, respectively. The lower part of the device 800 may be embodied in form of a ball grid array (BGA) or a land grid array (LGA).

Figure 9:
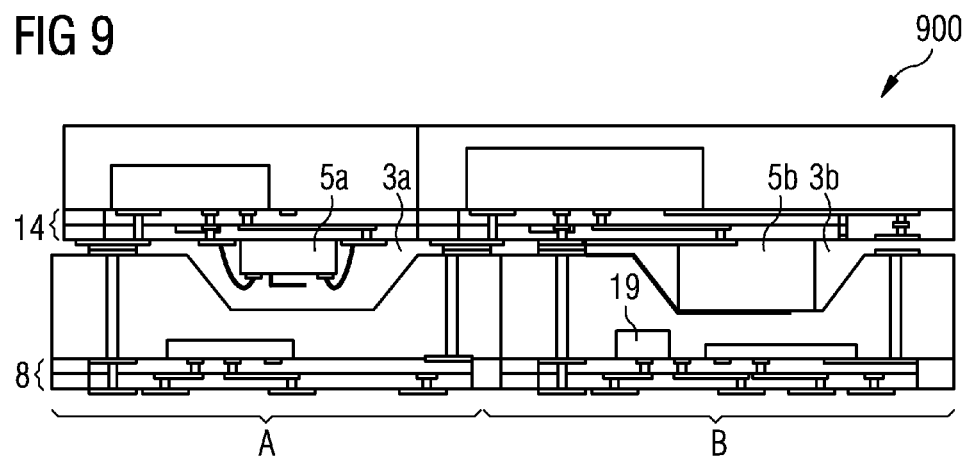
FIG. 9 schematically illustrates a cross-section of a device 900 as a further exemplary embodiment.

FIG. 9 schematically illustrates a device 900 as a further exemplary embodiment. The device 900 includes a first component A including a first cavity 3a and a second component B including a second cavity 3b. The device 900 may be regarded as a combination of the devices 600 and 700 arranged adjacent to each other and functionally coupled. Here, component A corresponds to the device 600 and component B corresponds to the device 700. In contrast to the device 700, the component B includes a further electrical component 19 whose embodiment depends on the desired functionality of the device 900. Note that components A and B are not separated from one another, but connected by a first redistribution layer 8 and a second redistribution layer 14. It is thus understood that components of device 900 may interact and communicate with one another in any desired manner. For example, a battery 5b may provide power to all electrical components and semiconductor chips of the device 900.

The device of FIG. 9 may embody a sensor node application that does not require an external power supply thanks to the battery 5b. The first cavity 3a encloses a sensor chip 5a while the second cavity 3b encloses the battery 5b. For example, the device 900 may include an RF transceiver circuit. Data measured by the sensor chip 5a may then be sent to an external receiver station (not shown).

FIG. 10 schematically illustrates a device 1000 as a further exemplary embodiment. The device 1000 includes similar components as shown in FIG. 6. In contrast to the device 600, the device 1000 does not include a redistribution layer on the lower face of the encapsulant 2. Further, the electrical component 5 of the device 1000 corresponds to a microphone, for example, an Si-microphone. The microphone 5 includes a microphone chip 20 including a cavity 21 that may be fabricated by an etching process and a membrane 22. The device 1000 further includes an aperture 23 in the encapsulant 2 to provide an inlet of a signal to be measured by the microphone 5. It is understood that devices illustrated in other figures may also include an aperture depending on the desired functionality of the respective device.

FIGS. 11A to 11G schematically illustrate an exemplary method to fabricate a device 1100. The method may be based on the eWLP technology as described in foregoing paragraphs. The device 1100 is similar to the device 600. Above given comments concerning components of device 600 therefore may also hold true for like components of device 1100.

FIG. 11A shows a first method step in which first semiconductor chips 1a, 1b, 1c are mounted in a spaced apart manner on a support carrier 24. In a second method step (see FIG. 11B) the spaced-apart semiconductor chips 1a, 1b, 1c on the support carrier 24 are encapsulated, for example, by using a liquid mold compound 2 that is dispensed over the semiconductor chips 1a, 1b, 1c on the support carrier 24. Thereby, the gaps between the placed chips 1a, 1b, 1c are filled with liquid mold compound 2. For example, a molding tool may be used during the molding process. Note that after a curing of the mold compound 2, the encapsulant resulting from the mold compound 2 includes multiple cavities 3a, 3b and 3c which may be used to enclose electrical components. The first semiconductor chips 1a, 1b, 1c are distributed within the encapsulant 2 in a regular, array-like fashion.

After the encapsulation of the semiconductor chips 1a, 1b, 1c and thereby forming the cavities 3a, 3b and 3c, the support carrier 24 is removed to obtain the reconfigured wafer (see FIG. 11C). In a next method step illustrated in FIG. 11D a redistribution layer 8 is fabricated on a lower face of the encapsulant 2 by applying dielectric layers and a metal redistribution layer typically by using thin-film processes. Optionally, appropriate connecting elements such as solder balls, solder bumps or metal elements may be applied on wafer level as well.

FIG. 11E illustrates a next method step in which through connections 6 are realized to provide an electrical connection between an upper face of the encapsulant 2 and the first redistribution layer 8. Methods for providing the through connections 6 have been described in foregoing paragraphs. Note that the fabrication of the through connections 6 may also be realized earlier in the presented method, for example, before applying the first redistribution layer 8.

Figure 11F:
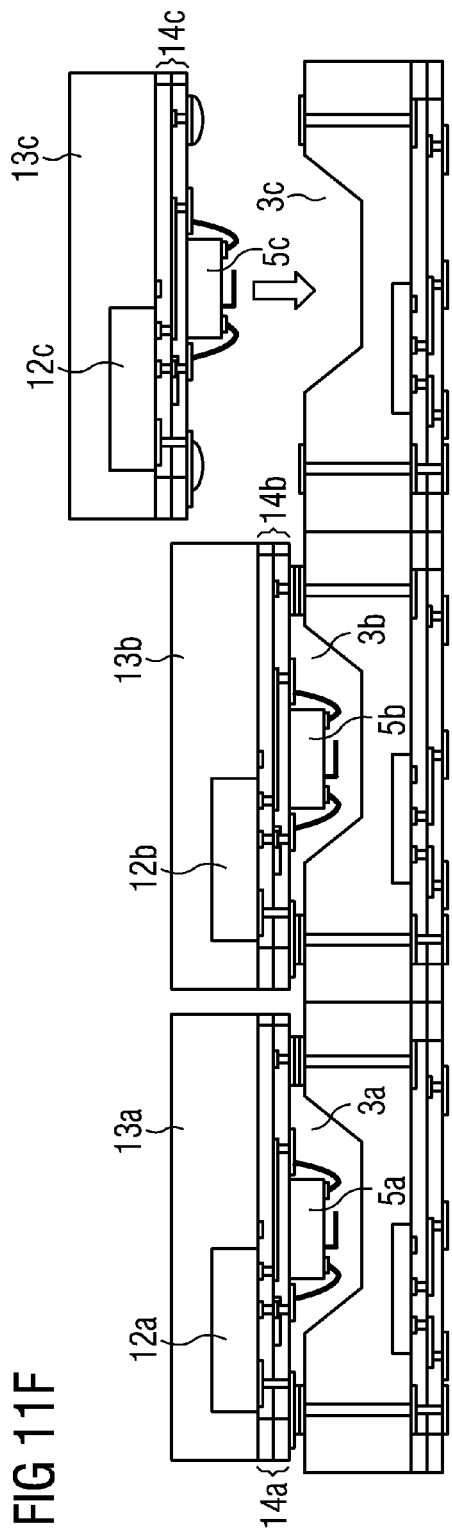

In a next step (see FIG. 11F) components including electrical components 5a, 5b, 5c, second semiconductor chips 12a, 12b, 12c, second encapsulants 13a, 13b, 13c and second redistribution layers 14a, 14b, 14c are arranged such that the cavities 3a, 3b and 3c each enclose one of the electrical components 5a, 5b, 5c. In the embodiment of FIG. 11F the components are attached individually. Note, however, that there is also the possibility of the components not yet being separated from each other during the attachment, i.e., the components may also be attached in form of an unsawn wafer.

Figure 11G:
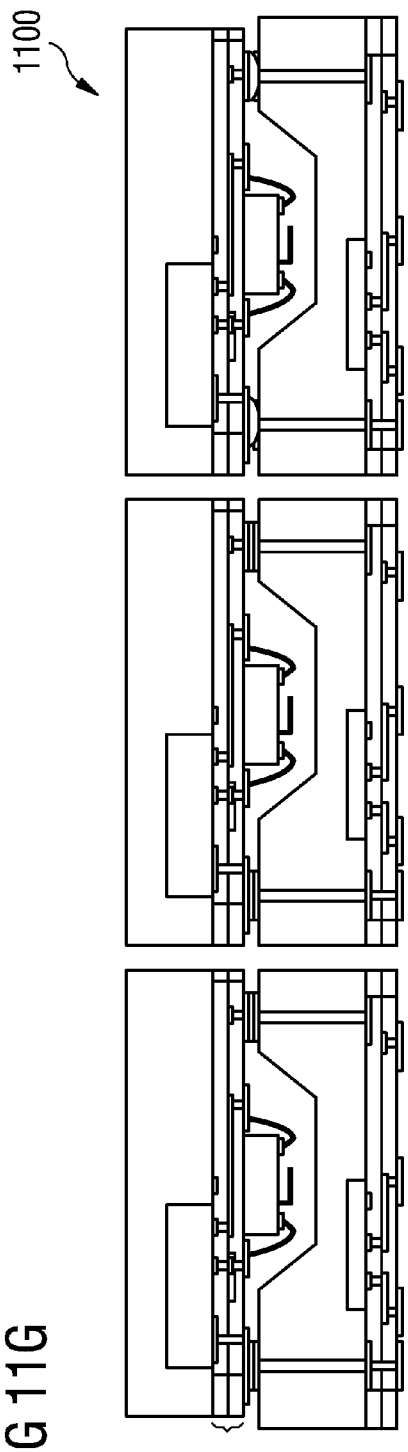

FIG. 11G shows a further step, wherein the arrangement of FIG. 11F is singulated to obtain individual devices 1100. The singulated devices of FIG. 11G are similar to the device of FIG. 6. It is understood that devices illustrated in other figures may be obtained by applying methods similar to the method of FIGS. 11A to 11G.

FIG. 12 schematically illustrates a device 1200 as a further exemplary embodiment. The device 1200 includes a semiconductor chip 1 encapsulated by an encapsulant 2. The encapsulant 2 includes a cavity 3 into which an electrical component 5 is mounted. The device 1200 further includes electrical through connections 6 extending from a lower face of the encapsulant 2 to an upper face of the encapsulant 2. A redistribution layer 8 including dielectric and conductive layers is applied on the lower face of the encapsulant 2 such that an electrical connections between possible external applications and the through connections 6, as well as between possible external applications and the semiconductor chip 1 are provided.

Electrical connections 24 are arranged on the upper face of the encapsulant 2, for example in form of conductor lines. The electrical connections 24 extend from the through connections 6 into the cavity 3. The electrical component 5 includes electrical contacts 7 on its upper side which are electrically coupled to the electrical connections 24 by bond wires 25. This way, the electrical component 5 may be electrically coupled to external applications. The cavity 3 is filled with a soft material 26 covering the electrical component 5, for example, to provide mechanical support or exclude contaminations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a packaged device, the method comprising:
    encapsulating a first semiconductor chip with a first encapsulant, wherein the first encapsulant comprises a cavity on a first main surface;
    mounting an electrical component on a carrier, the electrical component being a MEMS device; and
    placing the carrier on the first main surface of the first encapsulant such that the electrical component is enclosed by the cavity.

2. The method of claim 1, further comprising forming an electrical through connection through an entire thickness of the first encapsulant.

3. The method of claim 2, further comprising forming a first redistribution layer on a second main surface of the first encapsulant, the second main surface connecting the through connection.

4. The method of claim 3, further comprising forming a second redistribution layer on the first main surface of the first encapsulant, the second redistribution layer connecting the through connection.

5. The method of claim 1, further comprising mounting the first semiconductor chip on a support carrier before encapsulating the first semiconductor chip and removing the support carrier after encapsulating the first semiconductor chip.

6. The method of claim 1, further comprising forming an aperture in the first encapsulant such that the aperture connects the cavity.

7. The method of claim 1, further comprising encapsulating a second semiconductor chip with a second encapsulant.

8. A method for manufacturing a packaged semiconductor device, the method comprising:
encapsulating first semiconductor chips such that cavities are formed on a first main surface of the first encapsulant;
forming a redistribution layer over a second main surface of the first encapsulant such that the first semiconductor chips are connected to the redistribution layer;
forming first through vias in the first encapsulant such that the first main surface is connected to the second main surface;
locating semiconductor components in the cavities by placing assembled semiconductor components on the first main surface of the first encapsulant; and
singulating the first encapsulant thereby forming the packaged semiconductor device such that the packaged semiconductor device comprises a first semiconductor chip, a second semiconductor chip, a first through via and a semiconductor component.

9. The method of claim 8, wherein a assembled semiconductor component is formed comprising:
encapsulating the second semiconductor chip in a second encapsulant;
forming a second redistribution layer on a first main surface of the second encapsulant; and
mounting the semiconductor component on the second redistribution layer.

10. The method of claim 9, further comprising connecting the semiconductor component to the first through via through a first bond wire and the second redistribution layer.

11. The method of claim 8, further comprising connecting the semiconductor component to the first through via along the first main surface of the first encapsulant.

12. The method of claim 8, further comprising forming second through vias in the first encapsulant such that the first main surface is connected to the second main surface and singulating the first encapsulant such that the packaged semiconductor device further comprises a second through via.

13. The method of claim 8, wherein the cavities are disposed over the first semiconductor chips.

14. A method for manufacturing a packaged device, the method comprising:
encapsulating a first semiconductor chip with a first encapsulant;
forming a first redistribution layer on the first encapsulant;
placing an electrical component on the first redistribution layer;
forming a second encapsulant having a cavity; and
placing a first main surface of the second encapsulant on a first main surface of the first encapsulant such that the electrical component is enclosed by the cavity.

15. The method of claim 14, further comprising forming an aperture in the second encapsulant.

16. The method of claim 14, further comprising encapsulating a second semiconductor chip with the second encapsulant, forming a first through via connecting the first main surface of the second encapsulant and a second main surface of the second encapsulant, and forming a second redistribution layer on the second main surface of the second encapsulant.

17. The method of claim 16, further comprising forming a second through via in the second encapsulant, the second through via connecting the second main surface of the second encapsulant with the first mains surface of the second encapsulant.

18. The method of claim 16, further comprising forming a ball grid array or a land grid array on the second redistribution layer.

19. A method for manufacturing a packaged device, the method comprising:
encapsulating a first semiconductor chip with a first encapsulant, wherein the first encapsulant comprises a cavity, wherein encapsulating the first semiconductor chip with the first encapsulant comprises encapsulating the first semiconductor chip with a molding compound and forming the cavity in a molding tool;
mounting an electrical component on a carrier; and
placing the carrier on a first main surface of the first encapsulant such that the electrical component is enclosed by the cavity.

20. A method for manufacturing a packaged device, the method comprising:
encapsulating a first semiconductor chip with a first encapsulant, wherein the first encapsulant comprises a cavity on a first main surface;
forming an electrical through connection through the first encapsulant;
forming a first redistribution layer on a second main surface of the first encapsulant, the second main surface connecting the through connection;
mounting an electrical component on a carrier; and
placing the carrier on the first main surface of the first encapsulant such that the electrical component is enclosed by the cavity.

21. The method of claim 20, further comprising forming a second redistribution layer on the first main surface of the first encapsulant, the second redistribution layer connecting the through connection.

22. A method for manufacturing a packaged device, the method comprising:
encapsulating a first semiconductor chip with a first encapsulant, wherein the first encapsulant comprises a cavity;
mounting the first semiconductor chip on a support carrier before encapsulating the first semiconductor chip and removing the support carrier after encapsulating the first semiconductor chip;
mounting an electrical component on a carrier; and
placing the carrier on a first main surface of the first encapsulant such that the electrical component is enclosed by the cavity.

23. A method for manufacturing a packaged device, the method comprising:
encapsulating a first semiconductor chip with a first encapsulant, wherein the first encapsulant comprises a cavity;
mounting an electrical component on a carrier, the electrical component being a power supply; and
placing the carrier on a first main surface of the first encapsulant such that the electrical component is enclosed by the cavity.

24. The method of claim 23, further comprising forming a first redistribution layer on a second main surface of the first encapsulant, the second main surface connecting the through connection.

25. A method for manufacturing a packaged device, the method comprising:
- encapsulating a first semiconductor chip with a first encapsulant, wherein the first encapsulant comprises a cavity on a first main surface;
- mounting an unpackaged electrical component on a carrier; and
- placing the carrier on the first main surface of the first encapsulant such that the unpackaged electrical component is enclosed by the cavity.

26. A method for manufacturing a packaged device, the method comprising:
- encapsulating a first semiconductor chip with a first encapsulant, wherein the first encapsulant comprises a cavity on a first main surface;
- mounting an electrical component on a carrier;
- placing the carrier on the first main surface of the first encapsulant such that the electrical component is disposed within the cavity; and
- sealing the cavity.

27. The method of claim 26, wherein sealing the cavity comprises sealing the cavity by using at least one of a glue and a soldered metal ring.

* * * * *

UNITED STATES PATENT AND TRADEMARK OFFICE
CERTIFICATE OF CORRECTION

PATENT NO. : 8,669,143 B2  
APPLICATION NO. : 13/708885  
DATED : March 11, 2014  
INVENTOR(S) : Horst Theuss Page 1 of 1

It is certified that error appears in the above-identified patent and that said Letters Patent is hereby corrected as shown below:

In the Claims
In Col. 11, line 30, claim 9, delete "a assembled" and insert --an assembled--.
In Col. 11, lines 59-60, claim 14, delete "a first main surface of".
In Col. 12, line 7, claim 17, delete "mains surface" and insert --main surface--.

Signed and Sealed this
Twenty-fourth Day of June, 2014

Michelle K. Lee
*Deputy Director of the United States Patent and Trademark Office*